(12) United States Patent
Zhang

(10) Patent No.: US 9,324,666 B2
(45) Date of Patent: Apr. 26, 2016

(54) ELECTRONIC DEVICE AND ELECTRONIC APPARATUS

(71) Applicant: LENOVO (BEIJING) LIMITED, Beijing (CN)

(72) Inventor: Xuhui Zhang, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 47 days.

(21) Appl. No.: 14/220,338

(22) Filed: Mar. 20, 2014

(65) Prior Publication Data

US 2015/0080065 A1 Mar. 19, 2015

(30) Foreign Application Priority Data

Sep. 17, 2013 (CN) .......................... 2013 1 0424970

(51) Int. Cl.
*H04M 1/00* (2006.01)
*H01L 23/66* (2006.01)

(52) U.S. Cl.
CPC ......... *H01L 23/66* (2013.01); *H01L 2924/0002* (2013.01)

(58) Field of Classification Search
CPC .... H04M 1/0256; H04M 1/7253; H04B 1/40; H04B 5/0012
USPC ...................... 455/550.1, 575.1, 575.3, 575.7
See application file for complete search history.

(56) References Cited

U.S. PATENT DOCUMENTS

| 2005/0075080 | A1* | 4/2005 | Zhang ..................... H01L 23/48 455/73 |
| 2005/0186987 | A1* | 8/2005 | Liu ............................. 455/556.1 |
| 2008/0020811 | A1* | 1/2008 | Lim ..................... H04M 1/0208 455/575.1 |
| 2014/0169486 | A1* | 6/2014 | McCormack ........ G09G 3/2096 375/259 |

\* cited by examiner

*Primary Examiner* — Ayodeji Ayotunde
(74) *Attorney, Agent, or Firm* — Scully Scott Murphy & Presser

(57) ABSTRACT

The present invention relates to electronic technology and discloses an electronic device and an electronic apparatus, capable of solving the problem that an electronic device cannot perform a wireless data communication with another electronic device. The electronic device comprises: a first communication chip provided in a first body and operative to transmit/receive a signal directionally; and at least one second communication chip provided in a second body and operative to transmit/receive a signal directionally, the second body being physically connected to the first body in a detachable manner, wherein the first body is capable of performing wireless data communication with the second body by using the first communication chip for transmitting/receiving data to/from the second communication chip.

12 Claims, 13 Drawing Sheets

ELECTRONIC DEVICE AND ELECTRONIC APPARATUS

TECHNICAL FIELD

The present invention relates to electronic technology, and more particularly, to an electronic device and an electronic apparatus.

BACKGROUND

With the development of science and technology, more and more electronic devices come into people's lives. For example, electronic devices such as smart phones, tablet computers, notebook computers and smart TVs provide great convenience in people's lives.

Currently, for a tablet computer as an example, in order to allow data communication between the tablet computer and a docking station or another electronic device, it is required to connect a data interface (e.g., USB interface or HDMI interface) in the tablet computer to a data cable and then connect the other end of the data cable to a corresponding data interface in the docking station or the other electronic device. Alternatively, the tablet computer can be inserted into a slot in the docking station or the other electronic device. At least one data interface is provided within the slot and the corresponding data interface in the tablet computer can be inserted therein. In this way, the tablet computer can perform data communication with the docking station or the other electronic device via the data interface within the slot.

However, the inventors have found at least the following problems during implementation of the solutions according to the embodiments of the present invention. The data communication between the tablet computer and the docking station or the other electronic device can only be performed when they are connected with each other via the data cable or data interface. That is, only wired data communication can be performed between the tablet computer and the docking station or the other electronic device. There is thus a problem that an electronic device cannot perform a wireless data communication with another electronic device.

SUMMARY

It is an object of the present invention to provide an electronic device and an electronic apparatus, capable of solving the problem that an electronic device cannot perform a wireless data communication with another electronic device.

In a first aspect, according to an embodiment of the present invention, an electronic device is provided. The electronic device comprises: a first communication chip provided in a first body and operative to transmit/receive a signal directionally; and at least one second communication chip provided in a second body and operative to transmit/receive a signal directionally. The second body is physically connected to the first body in a detachable manner. The first body is capable of performing wireless data communication with the second body by using the first communication chip for transmitting/receiving data to/from the second communication chip.

Optionally, the first body comprises a first end. The first communication chip is provided within the first end. A receiving slot is provided in the second body. The at least one second communication chip is provided inside the receiving slot. The first body and the second body may be in at least a first relative position or a second relative position when the first end is received in the receiving slot. When the first body and the second body are in the first relative position, the first communication chip can only transmit/receive a signal in a first direction. When the first body and the second body are in the second relative position, the first communication chip can only transmit/receive a signal in a second direction. The first relative position is different from the second relative position. The first direction is different from the second direction.

Optionally, the at least one second communication chip may be provided at a first position corresponding to the first direction and a second position corresponding to the second direction, respectively. When the first body and the second body may be in the first relative position, the first communication chip transmits/receives data to/from the second communication chip at the first position such that the first body can perform wireless data communication with the second body. When the first body and the second body are in the second relative position, the first communication chip transmits/receives data to/from the second communication chip at the second position such that the first body can perform wireless data communication with the second body.

Optionally, the at least one second communication chip is provided at a second position corresponding to the second direction and a reflection mechanism is provided in the second body. When the first body and the second body are in the first relative position, the first communication chip transmits a signal in the first direction, and the signal is reflected by the reflection mechanism and received by the second communication chip, such that the first body can perform wireless data communication with the second body.

Optionally, during a rotation of the first body from the first relative position to the second relative position with respect to the second body, each part on an outer surface of the first end is rotated with respect to a bottom face of the receiving slot.

Optionally, the second body further comprises a reflection mechanism provided inside the receiving slot of the second body. When the first end of the first body is received in the receiving slot, a signal transmitted by the first communication chip in the first direction is reflected by the reflection mechanism and received by the second communication chip in a third direction, or a signal transmitted by the second communication chip in the third direction is reflected by the reflection mechanism and received by the first communication chip in the first direction. The first direction is a direction in which the first communication chip transmits/receives a signal and the third direction is a direction in which the second communication chip transmits/receives a signal. The first direction is different from the third direction.

Optionally, the second body further comprises a support member. When the first end is received in the receiving slot, the support member supports the first body along with the bottom face of the receiving slot. The second communication chip is provided in the support member.

In a second aspect, according to an embodiment of the present invention, an electronic apparatus is provided. The electronic apparatus comprises: a casing having a first face on which an input unit is provided; a connection mechanism provided on the first face, the electronic apparatus being connectable to an electronic device in a detachable manner via the connection mechanism; at least one second communication chip provided inside the casing and operative to transmit/receive a signal directionally. The electronic apparatus is capable of performing wireless data communication with the electronic device by using the second communication chip for transmitting/receiving data to/from a first communication chip on the electronic device. The first communication chip is operative to transmit/receive a signal directionally.

Optionally, the connection mechanism is a receiving slot provided on the first face. The at least one second communication chip is provided inside the receiving slot. The electronic device and the electronic apparatus may be in at least a first relative position or a second relative position when the first end is received in the receiving slot. When the electronic device and the electronic apparatus are in the first relative position, the first communication chip can only transmit/receive a signal in a first direction. When the electronic device and the electronic apparatus are in the second relative position, the first communication chip can only transmit/receive a signal in a second direction, the first relative position being different from the second relative position. The first direction is different from the second direction.

Optionally, the at least one second communication chip may be provided at a first position corresponding to the first direction and a second position corresponding to the second direction, respectively. When the electronic device and the electronic apparatus are in the first relative position, the second communication chip at the first position transmits/receives data to/from the first communication chip such that the electronic device can perform wireless data communication with the electronic apparatus. When the electronic device and the electronic apparatus are in the second relative position, the second communication chip at the second position transmits/receives data to/from the first communication chip such that the electronic device can perform wireless data communication with the electronic apparatus.

Optionally, the at least one second communication chip is provided at a second position corresponding to the second direction and a reflection mechanism is provided in the electronic apparatus. When the electronic device and the electronic apparatus are in the first relative position, the first communication chip transmits a signal in the first direction, and the signal is reflected by the reflection mechanism and received by the second communication chip, such that the electronic device can perform wireless data communication with the electronic apparatus.

Optionally, during a rotation of the electronic apparatus from the first relative position to the second relative position with respect to the electronic device, each part on an outer surface of the first end is rotated with respect to a bottom face of the receiving slot.

Optionally, the electronic apparatus further comprises a reflection mechanism provided inside the receiving slot of the electronic apparatus. When the first end of the electronic device is received in the receiving slot, a signal transmitted by the first communication chip in the first direction is reflected by the reflection mechanism and received by the second communication chip in a third direction, or a signal transmitted by the second communication chip in the third direction is reflected by the reflection mechanism and received by the first communication chip in the first direction. The first direction is a direction in which the first communication chip transmits/receives a signal and the third direction is a direction in which the second communication chip transmits/receives a signal. The first direction is different from the third direction.

Optionally, the electronic apparatus further comprises a support member. When the first end is received in the receiving slot, the support member supports the electronic device along with the bottom face of the receiving slot. The second communication chip is provided in the support member.

The present invention has the following advantageous effects. Since the first communication chip for transmitting/receiving a signal is provided in the first body and the at least one second communication chip for transmitting/receiving a signal is provided in the second body, when the first body is connected to the second body in a detachable manner, the first body can perform wireless data communication with the second body by using the first communication chip for transmitting/receiving data to/from the second communication chip. In other words, the wireless data communication between the first body and the second body can be achieved by virtue of the wireless data transmission between the first communication chip and the second communication chip. In this way, the problem that an electronic device cannot perform a wireless data communication with another electronic device can be solved effectively. The wireless data communication between electronic devices is enabled and the user experience can be improved.

DETAILED DESCRIPTION OF THE EMBODIMENTS

The embodiments of the present application provide an electronic device and an electronic apparatus that are capable of solving the problem that an electronic device cannot perform a wireless data communication with another electronic device.

In order to solve the above problem that an electronic device cannot perform a wireless data communication with another electronic device, the general concept of the solutions according to the embodiments of the present application is as follows.

In the following, the solutions of the present invention will be described in detail with reference to the figures and embodiments. It is to be noted that the embodiments and the specific features thereof are provided for illustrating the details of the solutions of the present invention, rather than limiting the scope of the present invention. The embodiments and the features thereof can be combined with each other, provided that they do not conflict.

By providing a first communication chip for transmitting/receiving a signal in a first body and at least one second communication chip for transmitting/receiving a signal in a second body, when the first body is connected to the second body in a detachable manner, the first body can perform wireless data communication with the second body by using the first communication chip for transmitting/receiving data to/from the second communication chip. In other words, the wireless data communication between the first body and the second body can be achieved by virtue of the wireless data transmission between the first communication chip and the second communication chip. In this way, the problem that an electronic device cannot perform a wireless data communication with another electronic device can be solved effectively. The wireless data communication between electronic devices is enabled and the user experience can be improved.

Figure 1:
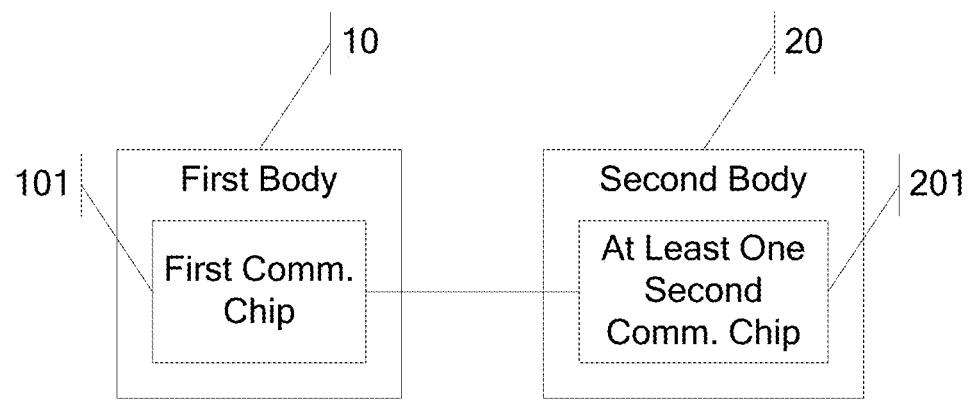
FIG. 1 is a block diagram showing a structure of an electronic device according to an embodiment of the present invention.

In the first aspect, according to an embodiment of the present invention, an electronic device is provided. The electronic device may be an electronic device having two bodies, such as an ordinary notebook computer, an ultrabook, a tablet computer and the like. As shown in FIG. 1, the electronic device includes a first communication chip 101 provided in a first body 10 and operative to transmit/receive a signal directionally; and at least one second communication chip 201 provided in a second body 20 and operative to transmit/receive a signal directionally. The second body 20 is physically connected to the first body 10 in a detachable manner. The first body 10 is capable of performing wireless data communication with the second body 20 by using the first communication chip 101 for transmitting/receiving data to/from the second communication chip 201.

In this embodiment, each of the first communication chip 101 and the second communication chip 201 can be a chip capable of transmitting and receiving signals. Thus, by transmitting and receiving signals on a surface of each chip, a short range (e.g., 1 cm, 5 cm or 10 cm) data communication between the first body 10 and the second body 20 can be achieved without any wired connection. It is not necessary to use any existing undirectional, complicated communication protocols such as Bluetooth, Wi-Fi and Near Field Communication (NFC). A reliable, directional end-to-end communication can be achieved by using only a few chips.

Figure 2:
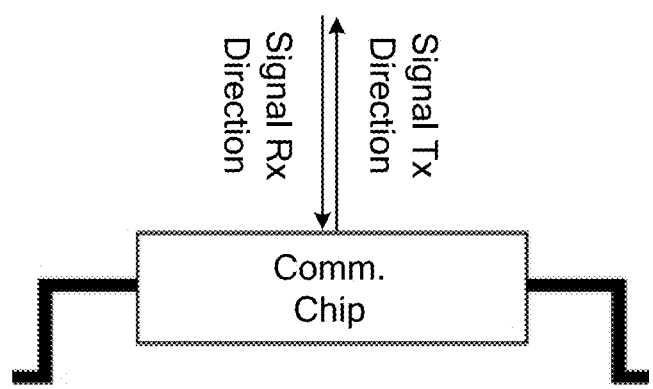
FIG. 2 is a schematic diagram showing directions in which signals are transmitted or received by a communication chip according to an embodiment of the present invention.
Figure 3:
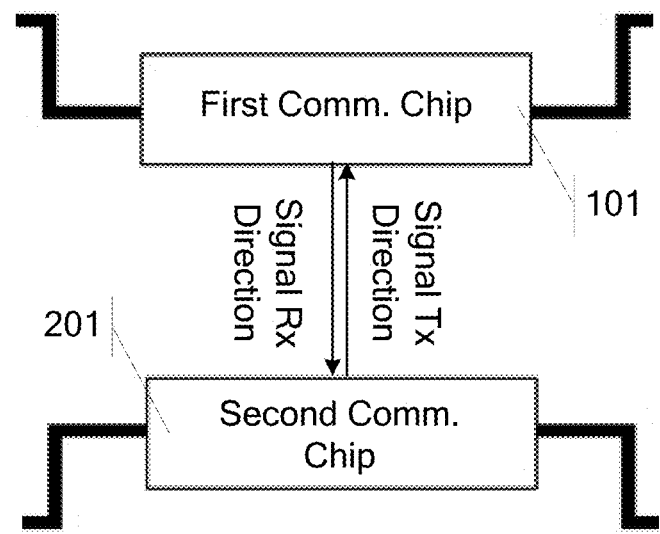
FIG. 3 is a schematic diagram showing a relative position between a first communication chip and a second communication chip according to an embodiment of the present invention.

In particular, the direction in which each communication chip transmits or receives signals can be a direction vertical to the surface of the chip, as shown in FIG. 2. In an example where there is one first communication chip 101 and one second communication chip 201, when the chip surface of the first communication chip 101 covers more than a threshold percentage of the area of the second communication chip, data can be transmitted and received between these two communication chips. The threshold percentage can be e.g., 30%, 50% or 70% and the present invention is not limited to any specific threshold percentage. Preferably, as shown in FIG. 3, when the chip surfaces of the first communication chip 101 and the second communication chip 201 are parallel with and fully opposite to each other, data can be transmitted and received between these two communication chips.

In particular, the electronic device may have, but not limited to, one of the following two structures.

With a first structure, the first body 10 includes a first end and the first communication chip 101 is provided within the first end. A receiving slot is provided in the second body 20 and the at least one second communication chip 201 is provided inside the receiving slot, e.g., on a side wall of the receiving slot or inside the casing of the receiving slot. In this case, the first body 10 and the second body 20 may be in at least a first relative position or a second relative position when the first end is received in the receiving slot. When the first body 10 is switched from the first relative position to the second relative position with respect to the second body 20, the position of each part on the first body 10 is changed with respect to the second body 20. Thus, it is impossible to provide the short range communication between the first body 10 and the second body 20 by providing only one first communication chip 101 and one second communication chip 201 on the first body 10 and the second body 20, respectively, without any other mechanism.

Hence, in the case where the electronic device has the above first structure, it may have, but not limited to, one of the following two specific structures.

Figure 4A:
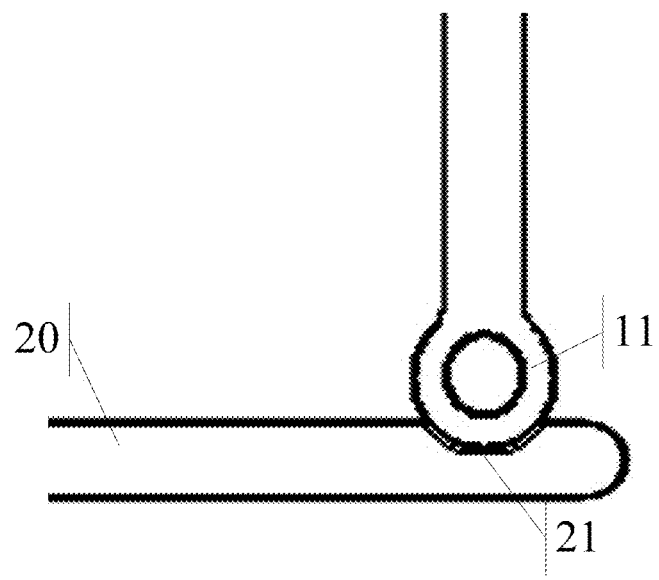
FIGS. 4A-4B are schematic diagrams showing connections between a first body and a second body according to an embodiment of the present invention.

FIG. 4A shows a first specific structure. As shown, the outer surface of the first end 11 is a smooth curved surface that matches the bottom face of the receiving slot 21. The first body 10 is rotatable with respect to the second body 20. During the rotation of the first body 10 from the first relative position to the second relative position with respect to the second body 20, each part on the outer surface of the first end 11 is rotated with respect to the bottom face of the receiving slot 21. That is, a first end face 110 fully matches the bottom face 210 of the receiving slot. In other words, when the first body is fixedly connected with the second body 20, the first end face 110 fully fits into the bottom face 210 of the receiving slot. In order to facilitate the rotation of the first body 10 with respect to the second body 20, each of the first end face 110 and the bottom face 210 of the receiving slot is a smooth curved surface, preferably a surface having the same curvature.

Preferably, in order to provide a better rotation effect, as shown in FIG. 4A, the first body 10 is rotated about a central axis with respect to the second body. Here the central axis has the same distance to any part on the first end face 110. In other words, the first end face 110 is the outer surface of a cylinder having the central axis as its axis.

Figure 5A:
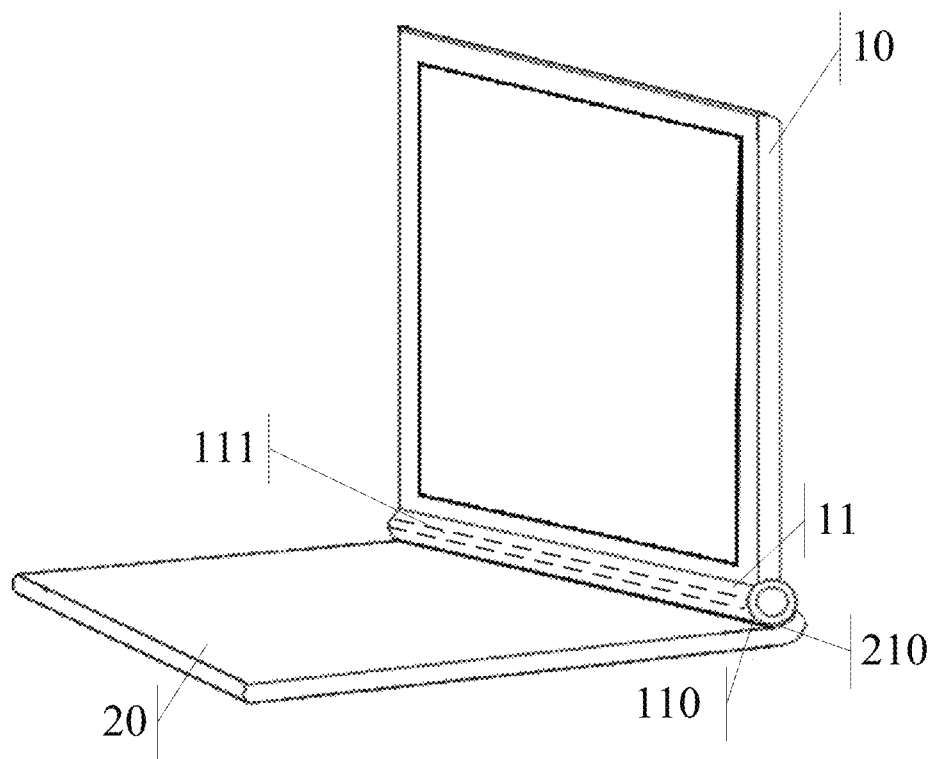
FIGS. 5A-5B are oblique views of an electronic device according to an embodiment of the present invention.
Figure 5B:
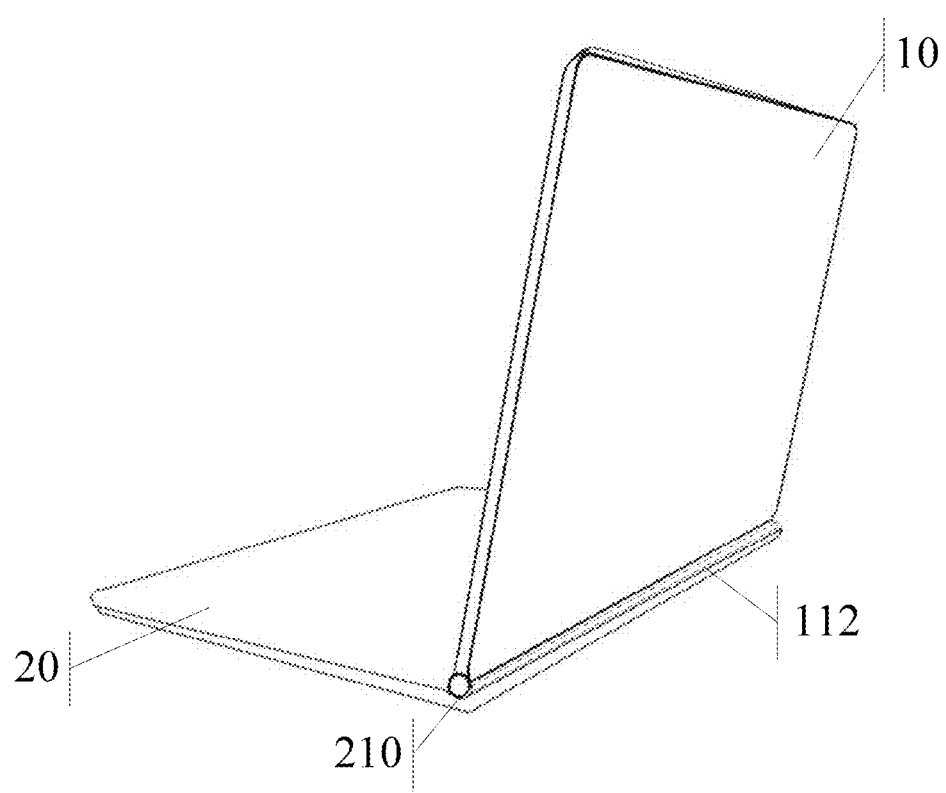

Further, as shown in FIGS. 5A and 5B, the first end face 110 of the first end has a first area 111 and a second area 112 that do not overlap each other. Here, the first area 111 comes into contact with the bottom face 210 of the receiving slot on the second body 20 when the first body 10 and the second body 20 are in the first relative position and the second area 112 comes into contact with the bottom face 210 of the receiving slot when the first body 10 and the second body 20 are in the second relative position. During the process in which the first body 10 is rotated, subject to a first applied force, from the first relative position to the second relative position with respect to the second body 20, the first body 10 maintains to be fixedly connected with the second body 20. During the process in which the first body 10 is rotated, subject to the first applied force, from the first relative position to the second relative position with respect to the second body 20, if the first applied force disappears, the first body 10 can maintain at a third angle with respect to the second body 20. Here the third angle can be any arbitrary angle between the first relative position and the second relative position.

Further, the first area 111 comes into contact with the bottom face 210 of the receiving slot on the second body 20 when the first body 10 and the second body 20 are in the first relative position and the second area 112 comes into contact with the bottom face 210 of the receiving slot when the first body 10 and the second body 20 are in the second relative position. In other words, during the rotation of the first body 10 with respect to the second body 20, the contact face between the first end face 110 and the bottom face 210 of the receiving slot varies and no part on the first end face 110 is fixedly connected with the bottom face 210 of the receiving slot. That is, during the process in which the first body 10 is rotated, subject to the first applied force, from the first relative position to the second relative position with respect to the second body 20, each part on the first end face 110 moves with respect to the bottom face 210 of the receiving slot.

In particular, when the first body 10 is connected with the second body 20, assuming that the first body 10 and the second body 20 are in the first relative position (i.e., the angle between the first body 10 and the second body 20 is 0°) at this time, the user may apply a first applied force to a second end 12 of the first body 10 that is opposite to the first end 11, so as to pull the first body 10 in a direction away from the second body 20. In this case, the first body 10 is rotated with respect to the second body 20. During the rotation to the second relative position, if the user withdraws the first applied force (i.e., if the first applied force disappears) when the angle between the first body 10 and the second body 20 is the third angle, e.g., 45°, the rotation of the first body 10 with respect to the second body 20 will be stopped and the first body 10 will maintain at the third angle.

Further, a first magnetic member 113 can be provided within the first end 11 and a second magnetic member 211 can be provided on the second body 20. By virtue of mutual attraction between the first magnetic member 113 and the second magnetic member 211, the first body 10 can be fixedly connected with the second body 20 in a detachable manner. Furthermore, by virtue of the attraction force between the first magnetic member 113 and the second magnetic member 211 as well as the friction force between the first end face 110 and the bottom face 210 of the receiving slot, during the process in which the first body 10 is rotated, subject to the first applied force, from the first relative position to the second relative position with respect to the second body 20, the first body 10 can maintains at the third angle with respect to the second body 20 when the first applied force disappears.

Figure 6:
FIG. 6 is an oblique view of a first body according to an embodiment of the present invention.
Figure 7A:
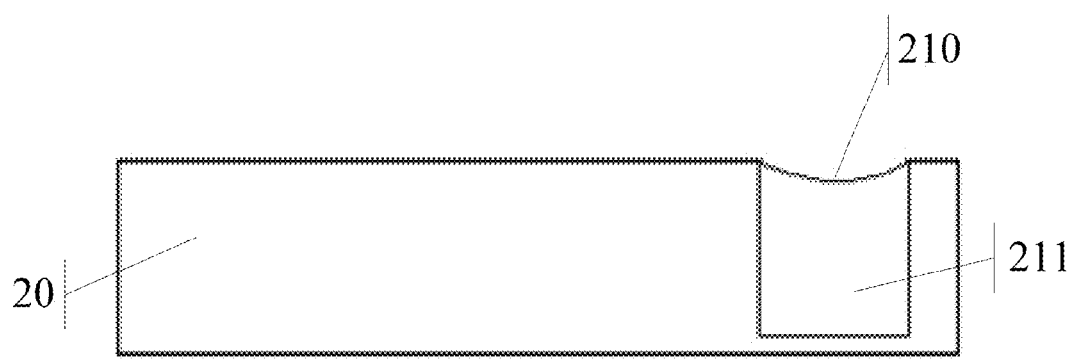
FIGS. 7A-7B are oblique views of a second body according to an embodiment of the present invention.
Figure 7B:
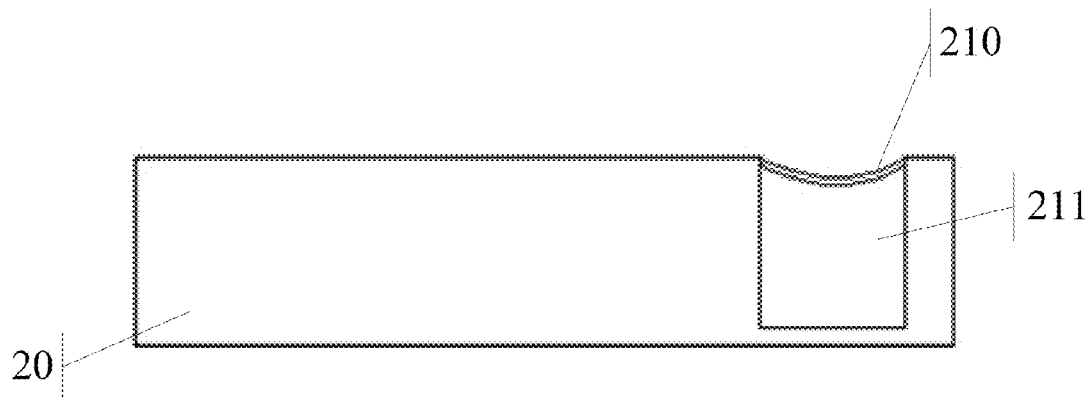

In particular, as shown in FIG. 6, the first magnetic member 113 is provided within the first end 11 (i.e., it is enclosed by the first end face 110 of the first end 11 of the electronic device and is not exposed) and is invisible to the user. The second magnetic member 211 may have two implementation specific arrangements. As shown in FIG. 7A, the second magnetic member 211 can be embedded into the second body 20 and the receiving slot can be provided on a surface of the second magnetic member 211. That is, the second magnetic member 211 is exposed outside the second body 20. Of course, in order to increase the friction force between the first body 10 and the second body 20, the second magnetic member 211 can alternatively be arranged below the casing of the second body 20. That is, the second magnetic member 211 is enclosed by the casing of the second body 20. In this case, the receiving slot 21 is provided on the second body 20 and the bottom face 210 of the receiving slot is a part of the casing of the second body 20, as shown in FIG. 7B. Preferably, the bottom face 210 of the receiving slot can be made of a material having a large friction factor, such as rubber or silica gel. The present invention is not limited to any specific material.

Further, the first magnetic member 113 and the second magnetic member 211 may have, but not limited to, the following two arrangements.

Figure 8A:
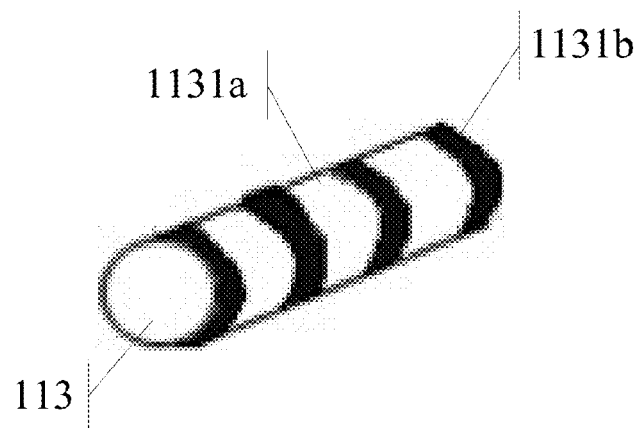
FIGS. 8A-8B are schematic diagrams showing a structure of a first magnetic member according to an embodiment of the present invention.

In the first arrangement, as shown in FIG. 8A, the first magnetic member 113 includes at least two magnet segments 1131*a* and at least one metal segment 1131*b*, which are arranged in a line. By arranging the magnet segments and the metal segment alternately, the overall magnetic intensity of the first magnetic member 113 can be improved, such that the first body 10 can maintain at the third angle stably with respect to the second body 20. In this case, the second magnetic member 211 can be an ordinary pure iron piece, an ordinary magnet or a magnetic member consisting of alternately arranged magnet segments and metal segments like the first magnetic member 113. The present invention is not limited to this.

Figure 8B:
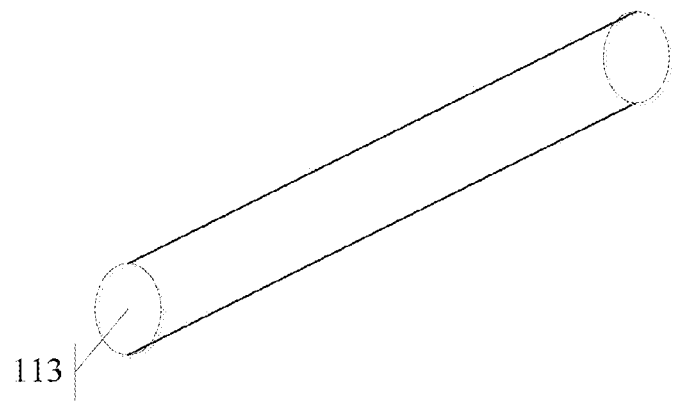

In the second arrangement, as shown in FIG. 8B, in order to allow the first magnetic member 113 to have the same magnetic force with respect to various parts on the bottom face 210 of the receiving slot, the first magnetic member 113 can be a prismatic magnet. Preferably, it can be a cylindrical magnet or a polygonal prismatic magnet. In this case, the second magnetic member 211 can also be an ordinary pure iron piece or an ordinary magnet. The present invention is not limited to this.

Of course, the arrangements of the first magnetic member 113 and the second magnetic member 211 are not limited to the above two arrangements and can be modified by those skilled in the art as desired.

Figure 9:
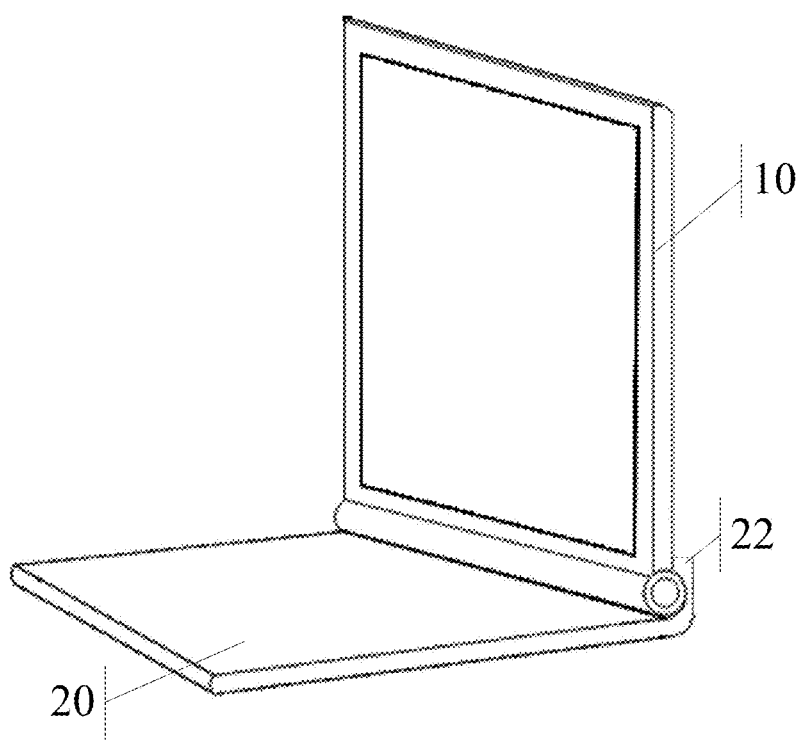
FIG. 9 is an oblique view of an electronic device according to another embodiment of the present invention.

In another embodiment, as shown in FIG. 9, no connection member is provided on the first body 10 and the second body 20. In this case, in order to detach the first body 10 from the second body 20, a constraining mechanism 22 is further provided on the second body 20. When the first body 10 has been rotated with respect to the second body 20 to the maximum open angle of the electronic device, the constraining mechanism 22 constrains the first body 10 from continuing rotating with respect to the second body 20.

Further, after the first body 10 has been rotated with respect to the second body 20 to the maximum open angle of the electronic device, if the first body 10 continues rotating with respect to the second body 20, the constraining mechanism 22 serves as a support point for the first body 10, such that the first body 10 can be detached from the second body 20 by virtue of the lever principle.

Figure 10A:
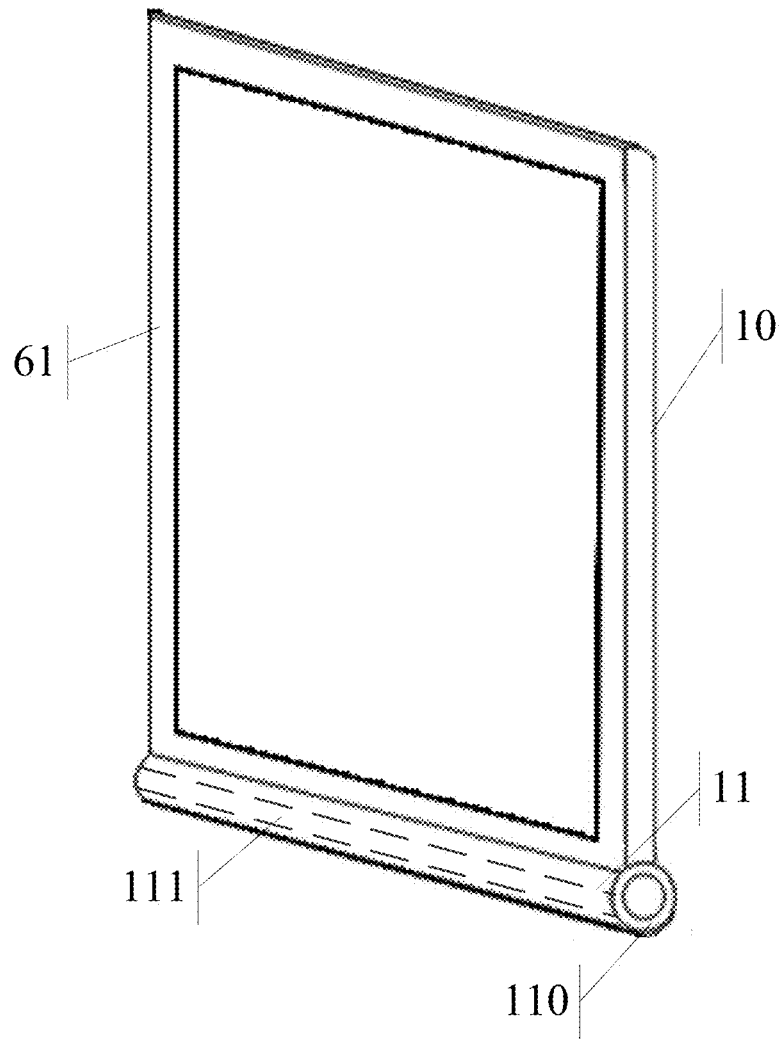
FIGS. 10A-10B are oblique views of an electronic device according to another embodiment of the present invention.
Figure 10B:
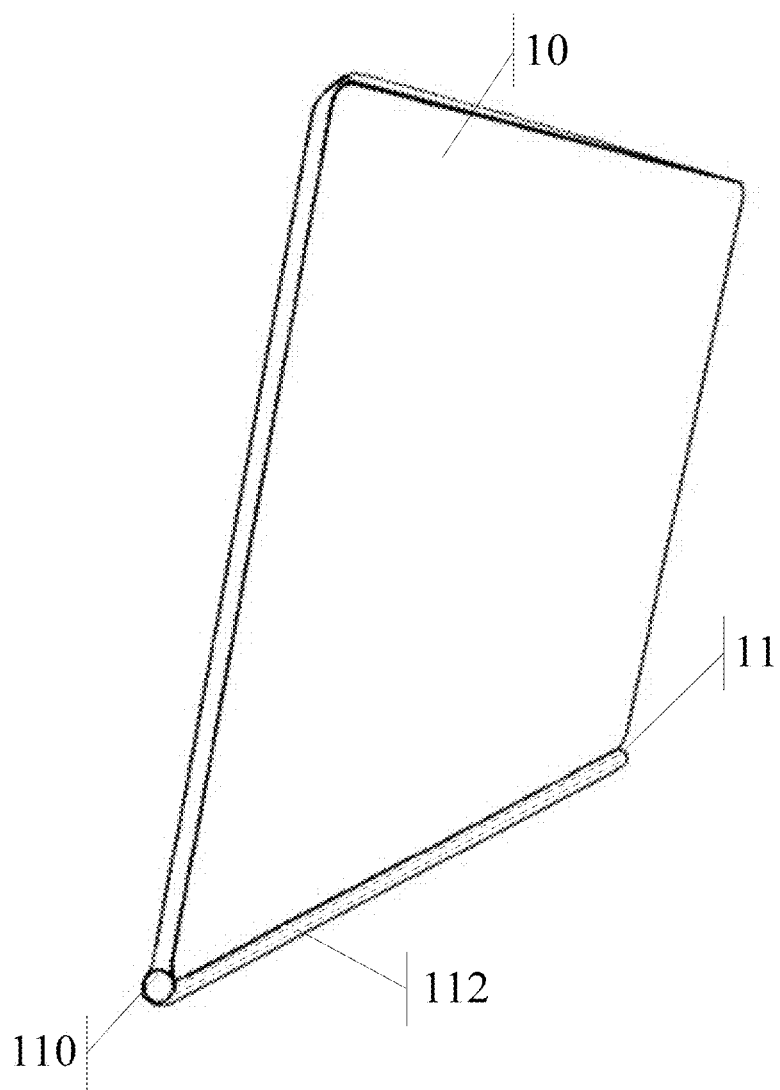

Then, as shown in FIG. 10A, when the first body 10 and the second body 20 are in the first relative position, the first communication chip 101 can only transmit/receive a signal in a first direction. Here the first direction is defined by assuming the second body 20 as a reference system. As shown in FIG. 10B, when the first body 10 and the second body 20 are in the second relative position, the first communication chip 101 can only transmit/receive a signal in a second direction. Similarly, the second direction is also defined by assuming the second body 20 as a reference system.

Figure 4B:
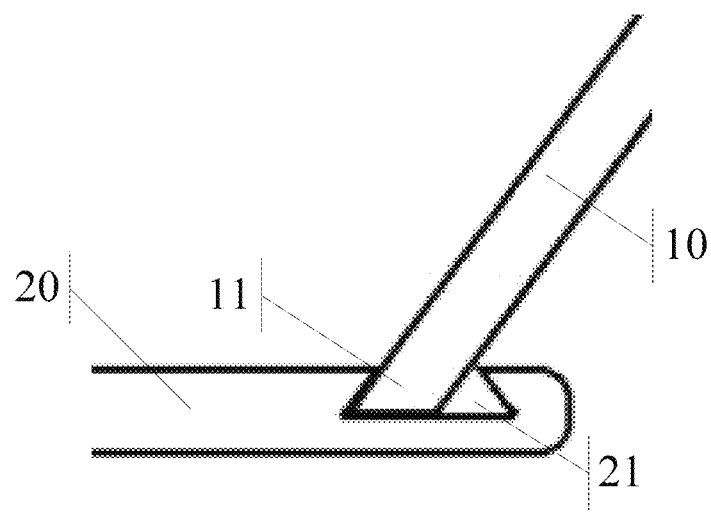
Figure 11A:
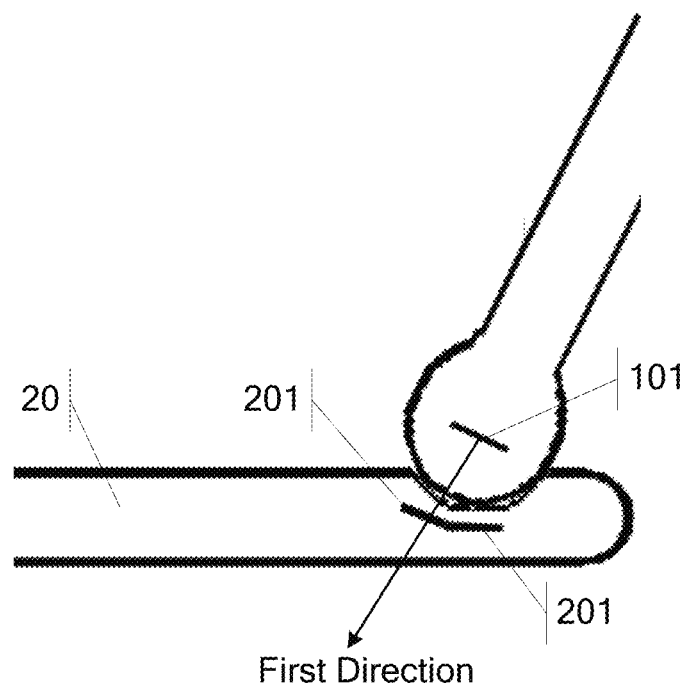
FIGS. 11A-11B are schematic diagrams showing a relative position between a first body and a second body according to an embodiment of the present invention.
Figure 11B:
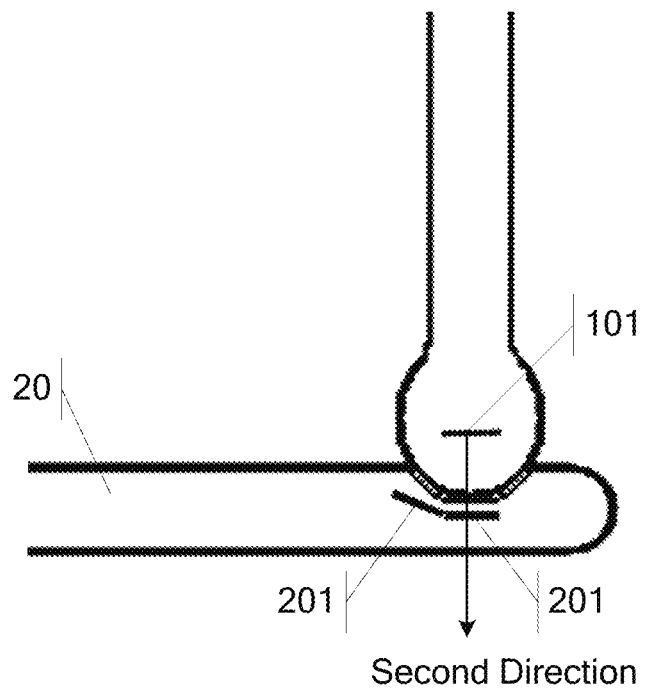

FIG. 4B shows a second specific structure. As shown, the first end 11 is planar and can be stuck in the receiving slot 21. The first body 10 can be inserted into the receiving slot 21 with the right side up or down, such that the first body 10 and the second body 20 may be in the first relative position as shown in FIG. 11A or the second relative position as shown in FIG. 11B. The first body 10 and the second body 20 are in the first relative position when the first body 10 is inserted into the receiving slot 21 with the right side up. The first body 10 and the second body 20 are in the second relative position when the first body 10 is switched from being inserted into the receiving slot 21 with the right side up to being inserted into the receiving slot 21 with the right side down. During this switching process, the position of each part on the first body 10 is changed with respect to the second body 20.

Then, as shown in FIG. 10A, when the first body 10 and the second body 20 are in the first relative position, the first communication chip 101 can only transmit/receive a signal in a first direction. Here the first direction is defined by assuming the second body 20 as a reference system. As shown in FIG. 11B, when the first body 10 and the second body 20 are in the second relative position, the first communication chip 101 can only transmit/receive a signal in a second direction. Similarly, the second direction is also defined by assuming the second body 20 as a reference system.

Of course, the first body 10 and the second body 20 are not limited to the above two specific structures. The present invention is not limited to any specific structure, as long as the first body 10 and the second body 20 may be in more than one relative position.

Further, for the first structure as described above, there are two non-limiting schemes for achieving wireless data communication between the first body 10 and the second body 20.

In the first scheme, at least two second communication chips are provided within the receiving slot 21. The at least two second communication chip 201 are provided at a first position corresponding to the first direction and a second position corresponding to the second direction, respectively. Referring to FIGS. 10A and 11A, when the first body 10 and the second body 20 are in the first relative position, the first communication chip 101 transmits/receives data in the first direction to/from the second communication chip 201 at the first position such that the first body 10 can perform wireless data communication with the second body 20. Referring to FIGS. 10B and 11B, when the first body 10 and the second body 20 are in the second relative position, the first communication chip 101 transmits/receives data in the second direction to/from the second communication chip 201 at the second position such that the first body 10 can perform wireless data communication with the second body 20.

Figure 12A:
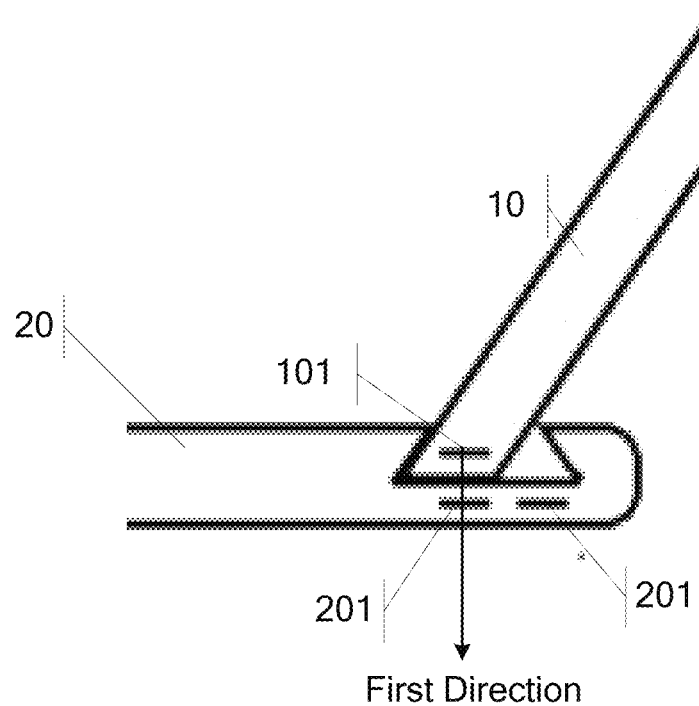
FIGS. 12A-12B are schematic diagrams showing a relative position between a first body and a second body according to another embodiment of the present invention.
Figure 12B:
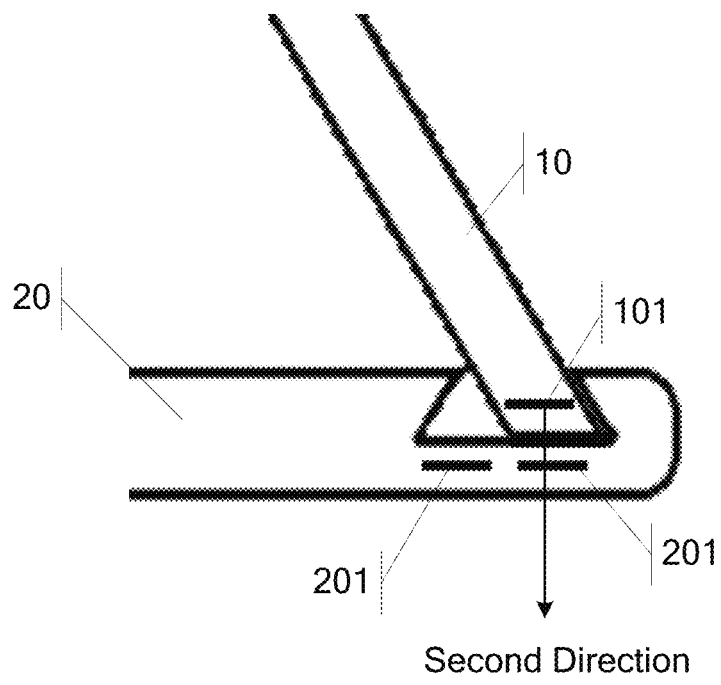

In the second scheme, only one second communication chip 201 is provided in the receiving slot 21. The second communication chip 201 is provided at a second position corresponding to the second direction. In this case, a reflection mechanism 202 is provided in the second body 20. As shown in FIGS. 12A and 12B, when the first body 10 and the second body 20 are in the first relative position, the first communication chip 101 transmits a signal in the first direction, the signal is reflected by the reflection mechanism 202 and received by the second communication chip 201, such that the first body 10 can perform wireless data communication with the second body 20. When the first body 10 and the second body 20 are in the second relative position, the first communication chip 101 transmits a signal in the second direction. Since in this case the first communication chip 101 faces the second communication chip 201, the first communication chip 101 can directly transmit/receive a signal to/from the second communication chip 201 without the reflection mechanism 202, such that the first body 10 can perform wireless data communication with the second body 20.

In this embodiment, the reflection mechanism 202 may include only one reflector, e.g., a metal reflector, such that the first communication chip 101 and the second communication chip 201 can communicate with each other via reflection by the reflector. Of course, in order to make the second body 20 thinner and lighter, the second communication chip 201 can be provided at a position away from the receiving slot. In this case, the reflection mechanism 202 may include several reflectors, such that a signal can be propagated between the first communication chip 101 and the second communication chip 201 via multiple reflections. The present invention is not limited to this.

In an implementation, the reflection mechanism 202 can be a planar reflector or a spherical reflector. The structure of the reflection mechanism 202 can be selected by those skilled in the art as desired and the present invention is not limited to this.

Figure 13A:
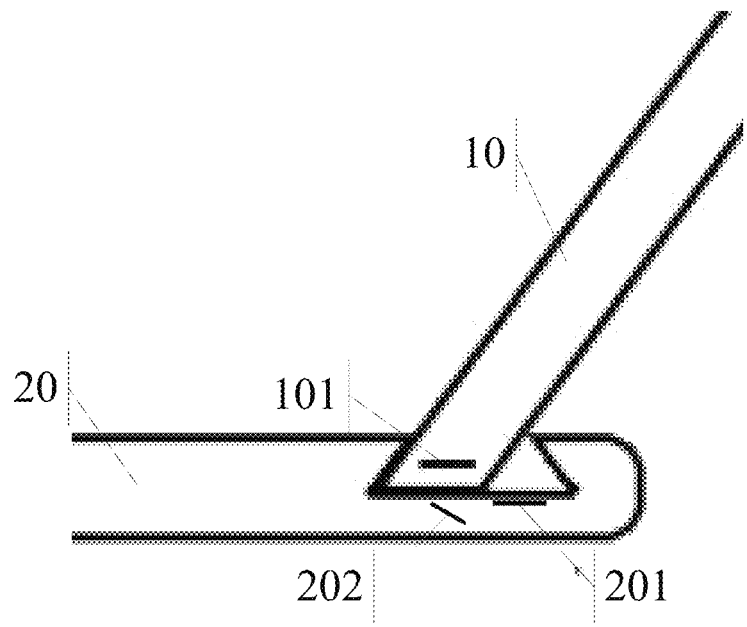
FIGS. 13A-13B are schematic diagrams showing a structure of a reflection mechanism according to an embodiment of the present invention.
Figure 13B:
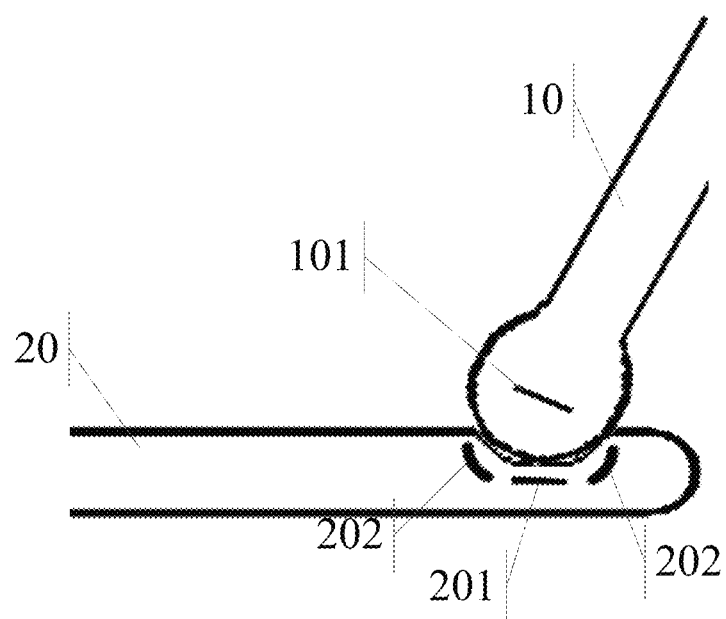

With a second structure, the first body 10 and the second body 20 may be in only one relative position, as shown in FIG. 13. In this case, the second body 20 further includes a reflection mechanism 202 provided inside the receiving slot 21 of the second body 20. When the first end 11 of the first body 10 is received in the receiving slot 21, a signal transmitted by the first communication chip 101 in the first direction is reflected by the reflection mechanism 202 and received by the second communication chip 201 in a third direction. Here the first direction is an incident direction for the reflection mechanism 202 and the third direction is a reflection direction for the reflection mechanism 202. The first direction and the third direction as used herein are defined by assuming the second body 20 as a reference system. Alternatively, a signal transmitted by the second communication chip 201 in the third direction is reflected by the reflection mechanism 202 and received by the first communication chip 101 in the first direction. Here the third direction is an incident direction for the reflection mechanism 202 and the first direction is a reflection direction for the reflection mechanism 202.

Figure 14:
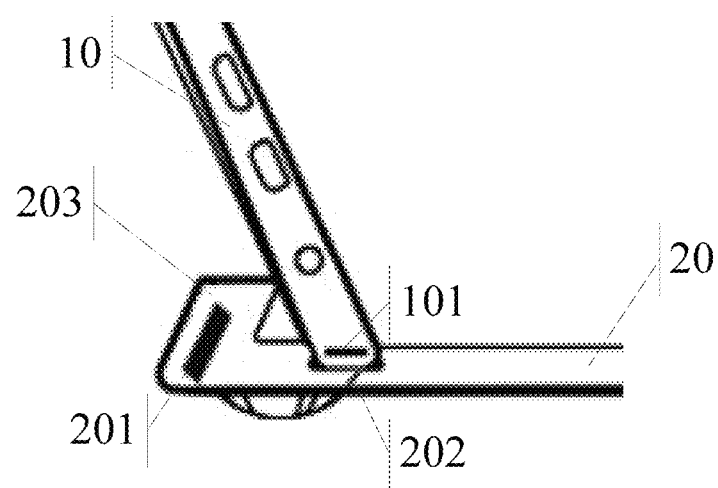
FIG. 14 is a schematic diagram showing a relative position between a first body and a second body according to another embodiment of the present invention.

Further, as shown in FIG. 14, the second body 20 further includes a support member 203. When the first end 11 is received in the receiving slot 21, the support member 203 supports the first body 10 along with the bottom face of the receiving slot 21. Here, in order to make the second body 20 thinner and lighter, the second communication chip 201 can be provided in the support member 203. Of course, the second communication chip 201 can be provided at a position away from the receiving slot 21. The present invention is not limited to this.

In another embodiment, the first body 10 can include a near-field undirectional communication module, such as Wi-Fi, Bluetooth or NFC module, such that the first body 10 can communicate wirelessly with another electronic device. Of course, the second body 20 may also include such near-field undirectional communication module. In this case, the first body 10 can perform data communication with the second body 20 even if the first body 10 is detached from the second body 20.

It can be seen from above that, since the first communication chip for transmitting/receiving a signal is provided in the first body and the at least one second communication chip for transmitting/receiving a signal is provided in the second body, when the first body is connected to the second body in a detachable manner, the first body can perform wireless data communication with the second body by using the first communication chip for transmitting/receiving data to/from the second communication chip. In other words, the wireless data communication between the first body and the second body can be achieved by virtue of the wireless data transmission between the first communication chip and the second communication chip. In this way, the user experience can be improved.

Figure 15:
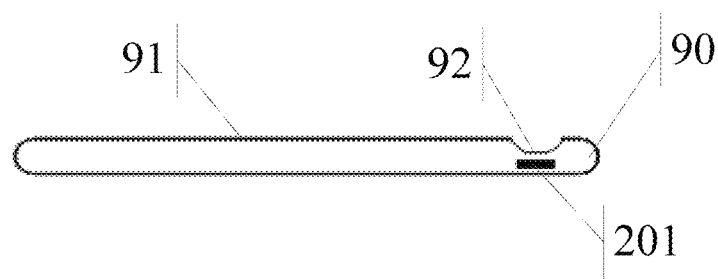
FIG. 15 is a schematic diagram showing a structure of an electronic apparatus according to an embodiment of the present invention.

In a second aspect, an electronic apparatus is also provided based on the same inventive concept. The electronic apparatus can be a part of a notebook computer that has an input unit or a docking station having an input unit. As shown in FIG. 15, the electronic apparatus includes: a casing 90 having a first face 91 on which an input unit 911 is provided; a connection mechanism 92 provided on the first face 91, the electronic apparatus being connected to an electronic device in a detachable manner via the connection mechanism 92; at least one second communication chip 201 provided inside the casing 91 and operative to transmit/receive a signal directionally. The electronic apparatus is capable of performing wireless data communication with the electronic device by using the second communication chip 201 for transmitting/receiving data to/from a first communication chip on the electronic device. The first communication chip is operative to transmit/receive a signal directionally.

In this embodiment, the electronic device is the same as the first body 10 described in connection with the above one or more embodiments and the description thereof will be omitted here.

Further, the connection mechanism 120 is a receiving slot provided on the first face 91. The at least one second communication chip 201 is provided inside the receiving slot, e.g., on a side wall of the receiving slot or inside the casing of the receiving slot. Referring to FIG. 4A, the outer surface of the first end 11 is a smooth curved surface that matches the bottom face of the receiving slot. The first body 10 is rotatable with respect to the second body 20. During the rotation of the first body 10 from the first relative position to the second relative position with respect to the second body 20, each part on the outer surface of the first end 11 is rotated with respect to the bottom face of the receiving slot.

As shown in FIG. 11A, when the first body 10 and the second body 20 are in the first relative position, the first communication chip 101 can only transmit/receive a signal in a first direction. Here the first direction is defined by assuming the second body 20 as a reference system. As shown in FIG. 11B, when the first body 10 and the second body 20 are in the second relative position, the first communication chip 101 can only transmit/receive a signal in a second direction. Similarly, the second direction is also defined by assuming the second body 20 as a reference system.

Alternatively, referring to FIG. 4B, the first end 11 is planar and can be stuck in the receiving slot 21. The first body 10 can be inserted into the receiving slot 21 with the right side up or down, such that the first body 10 and the second body 20 may be in the first relative position as shown in FIG. 12A or the second relative position as shown in FIG. 12B.

Then, as shown in FIG. 12A, when the first body 10 and the second body 20 are in the first relative position, the first communication chip 101 can only transmit/receive a signal in a first direction. Here the first direction is defined by assuming the second body 20 as a reference system. As shown in FIG. 12B, when the first body 10 and the second body 20 are in the second relative position, the first communication chip 101 can only transmit/receive a signal in a second direction. Similarly, the second direction is also defined by assuming the second body 20 as a reference system.

Of course, the first body 10 and the second body 20 are not limited to the above two specific structures. The present invention is not limited to any specific structure, as long as the first body 10 and the second body 20 may be in more than one relative position.

Optionally, in order to achieve the wireless data communication between the first body 10 and the second body 20, the at least one second communication chip 201 may be provided at a first position corresponding to the first direction and a second position corresponding to the second direction, respectively. When the electronic device and the electronic apparatus are in the first relative position, the second communication chip 201 at the first position transmits/receives data to/from the first communication chip 101 such that the electronic device can perform wireless data communication with the electronic apparatus. When the electronic device and the electronic apparatus are in the second relative position, the second communication chip 201 at the second position transmits/receives data to/from the first communication chip 101 such that the electronic device can perform wireless data communication with the electronic apparatus.

Optionally, in order to achieve the wireless data communication between the first body 10 and the second body 20, the at least one second communication chip 201 is provided at a second position corresponding to the second direction and a reflection mechanism 202 is provided in the electronic apparatus. When the electronic device and the electronic apparatus are in the first relative position, the first communication chip 101 transmits a signal in the first direction, and the signal is reflected by the reflection mechanism 202 and received by the second communication chip 201, such that the electronic device can perform wireless data communication with the electronic apparatus.

Further, as shown in FIG. 14, the electronic apparatus further includes a reflection mechanism 202 provided inside the receiving slot of the electronic apparatus. When the first end 11 of the electronic device is received in the receiving slot, a signal transmitted by the first communication chip 101 in the first direction is reflected by the reflection mechanism 202 and received by the second communication chip 201 in a third direction. The first direction and the third direction as used herein are defined by assuming the second body 20 as a reference system. Alternatively, a signal transmitted by the second communication chip 201 in the third direction is reflected by the reflection mechanism 202 and received by the first communication chip 101 in the first direction.

In particular, the electronic apparatus further includes a support member 203. When the first end 11 is received in the receiving slot 21, the support member 203 supports the electronic device along with the bottom face of the receiving slot 21. The second communication chip 201 can be provided in the support member 203. Of course, the second communication chip 201 can be provided at a position away from the receiving slot 21. The present invention is not limited to this.

The variants and specific examples described above in connection with the embodiments of the electronic device also apply to the electronic apparatus according to this embodiment. Those skilled in the art can learn the implementations of the electronic apparatus according to this embodiment from the above detailed description of the electronic device. For the sake of conciseness, further details of the electronic apparatus will be omitted here.

The solutions according to the embodiments of the present invention as described above have the least the following effects or advantages. Since the first communication chip 101 for transmitting/receiving a signal is provided in the first body and the at least one second communication chip 201 for transmitting/receiving a signal is provided in the second body, when the first body is connected to the second body in a detachable manner, the first body can perform wireless data communication with the second body by using the first communication chip 101 for transmitting/receiving data to/from the second communication chip 201. In other words, the wireless data communication between the first body and the second body can be achieved by virtue of the wireless data transmission between the first communication chip 101 and the second communication chip 201. In this way, the problem that an electronic device cannot perform a wireless data communication with another electronic device can be solved effectively. The wireless data communication between electronic devices is enabled and the user experience can be improved.

Obviously, various modifications and variants can be made to the present invention by those skilled in the art without departing from the spirit and scope of the present invention. Therefore, these modifications and variants are to be encompassed by the present invention if they fall within the scope of the present invention as defined by the claims and their equivalents.

What is claimed is:

1. An electronic device, comprising:
    a first communication chip provided in a first body and operative to transmit/receive a signal directionally; and
    at least one second communication chip provided in a second body and operative to transmit/receive a signal directionally, the second body being physically connected to the first body in a detachable manner,
    wherein the first body performs wireless data communication with the second body by transmitting/receiving a signal on a surface of the first communication chip to/from a surface of the second communication chip in a predetermined direction,
    wherein the first body comprises a first end, the first communication chip being provided within the first end, and a receiving slot is provided in the second body, the at least one second communication chip being provided inside the receiving slot, and
    wherein the first body and the second body are in at least a first relative position or a second relative position when the first end is received in the receiving slot;
    when the first body and the second body are in the first relative position, the first communication chip only transmits/receives a signal in a first direction; and
    when the first body and the second body are in the second relative position, the first communication chip only transmits/receives a signal in a second direction, the first relative position being different from the second relative position, the first direction being different from the second direction.

2. The electronic device of claim 1, wherein the at least one second communication chip is provided at a first position corresponding to the first direction and at a second position corresponding to the second direction, respectively;
    when the first body and the second body are in the first relative position, the first communication chip transmits/receives data to/from the second communication chip at the first position such that the first body performs wireless data communication with the second body;
    when the first body and the second body are in the second relative position, the first communication chip transmits/receives data to/from the second communication chip at the second position such that the first body performs wireless data communication with the second body.

3. The electronic device of claim 1, wherein the at least one second communication chip is provided at a second position corresponding to the second direction and a reflection mechanism is provided in the second body;
    when the first body and the second body are in the first relative position, the first communication chip transmits a signal in the first direction, the signal is reflected by the reflection mechanism and received by the second communication chip, such that the first body performs wireless data communication with the second body.

4. The electronic device of claim 1, wherein, during a rotation of the first body from the first relative position to the second relative position with respect to the second body, each part on an outer surface of the first end is rotated with respect to a bottom face of the receiving slot.

5. The electronic device of claim 1, wherein the second body further comprises a reflection mechanism provided inside the receiving slot of the second body;
    when the first end of the first body is received in the receiving slot, a signal transmitted by the first communication chip in the first direction is reflected by the reflection mechanism and received by the second communication chip in a third direction, or a signal transmitted by the second communication chip in the third direction is reflected by the reflection mechanism and received by the first communication chip in the first direction, the first direction being a direction in which the first communication chip transmits/receives a signal and the third direction being a direction in which the second communication chip transmits/receives a signal, the first direction being different from the third direction.

6. The electronic device of claim 5, wherein the second body further comprises a support member;
    when the first end is received in the receiving slot, the support member supports the first body along with the bottom face of the receiving slot; and
    the second communication chip is provided in the support member.

7. An electronic apparatus, comprising:
    a casing having a first face on which an input unit is provided;
    a connection mechanism provided on the first face, the electronic apparatus being connected to an electronic device in a detachable manner via the connection mechanism;
    at least one second communication chip provided inside the casing and operative to transmit/receive a signal directionally,
    wherein the electronic apparatus performs wireless data communication with the electronic device by transmitting/receiving a signal on a surface of the second communication chip to/from a surface of a first communication chip on the electronic device in a predetermined direction, the first communication chip being operative to transmit/receive a signal directionally,
    wherein the connection mechanism is a receiving slot provided on the first face, the at least one second communication chip being provided inside the receiving slot, and
    wherein the electronic device and the electronic apparatus are in at least a first relative position or a second relative position when the first end is received in the receiving slot;
    when the electronic device and the electronic apparatus are in the first relative position, the first communication chip only transmits/receives a signal in a first direction; and
    when the electronic device and the electronic apparatus are in the second relative position, the first communication chip only transmits/receives a signal in a second direction, the first relative position being different from the second relative position, the first direction being different from the second direction.

8. The electronic apparatus of claim 7, wherein the at least one second communication chip is provided at a first position corresponding to the first direction and at a second position corresponding to the second direction, respectively;
    when the electronic device and the electronic apparatus are in the first relative position, the second communication chip at the first position transmits/receives data to/from the first communication chip such that the electronic device performs wireless data communication with the electronic apparatus;

when the electronic device and the electronic apparatus are in the second relative position, the second communication chip at the second position transmits/receives data to/from the first communication chip such that the electronic device performs wireless data communication with the electronic apparatus.

9. The electronic apparatus of claim 7, wherein the at least one second communication chip is provided at a second position corresponding to the second direction and a reflection mechanism is provided in the electronic apparatus;

when the electronic device and the electronic apparatus are in the first relative position, the first communication chip transmits a signal in the first direction, the signal is reflected by the reflection mechanism and received by the second communication chip, such that the electronic device performs wireless data communication with the electronic apparatus.

10. The electronic apparatus of claim 7, wherein, during a rotation of the electronic apparatus from the first relative position to the second relative position with respect to the electronic device, each part on an outer surface of the first end is rotated with respect to a bottom face of the receiving slot.

11. The electronic apparatus of claim 7, wherein the electronic apparatus further comprises a reflection mechanism provided inside the receiving slot of the electronic apparatus;

when the first end of the electronic device is received in the receiving slot, a signal transmitted by the first communication chip in the first direction is reflected by the reflection mechanism and received by the second communication chip in a third direction, or a signal transmitted by the second communication chip in the third direction is reflected by the reflection mechanism and received by the first communication chip in the first direction, the first direction being a direction in which the first communication chip transmits/receives a signal and the third direction being a direction in which the second communication chip transmits/receives a signal, the first direction being different from the third direction.

12. The electronic apparatus of claim 11, wherein the electronic apparatus further comprises a support member;

when the first end is received in the receiving slot, the support member supports the electronic device along with the bottom face of the receiving slot; and the second communication chip is provided in the support member.

* * * * *